US006521510B1

(12) United States Patent
Fisher et al.

(10) Patent No.: US 6,521,510 B1
(45) Date of Patent: Feb. 18, 2003

(54) METHOD FOR SHALLOW TRENCH ISOLATION WITH REMOVAL OF STRAINED ISLAND EDGES

(75) Inventors: Philip Fisher, Foster City, CA (US); Darin A. Chan, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/105,998

(22) Filed: Mar. 25, 2002

Related U.S. Application Data

(60) Provisional application No. 60/278,107, filed on Mar. 23, 2001.

(51) Int. Cl.[7] .............................................. H01L 21/76
(52) U.S. Cl. ........................ 438/424; 438/426; 438/435
(58) Field of Search ................................ 438/424, 426, 438/435

(56) References Cited

U.S. PATENT DOCUMENTS

| | | | |
|---|---|---|---|
| 4,903,108 A | | 2/1990 | Young et al. |
| 4,916,086 A | * | 4/1990 | Takahashi et al. ........... 438/432 |
| 5,021,359 A | | 6/1991 | Young et al. |
| 5,034,789 A | | 7/1991 | Black ........................... 257/66 |
| 5,084,408 A | * | 1/1992 | Baba et al. .................. 438/431 |
| 5,126,817 A | | 6/1992 | Baba et al. |
| 5,258,332 A | | 11/1993 | Horioka et al. .............. 438/424 |
| 5,264,395 A | | 11/1993 | Bindal et al. ................ 438/430 |
| 5,279,865 A | | 1/1994 | Chebi et al. .................. 375/222 |
| 5,405,480 A | | 4/1995 | Benzing et al. ......... 156/345.48 |
| 5,416,041 A | | 5/1995 | Schwalke |
| 5,416,048 A | | 5/1995 | Blalock et al. ............. 438/695 |
| 5,445,988 A | | 8/1995 | Schwalke |
| 5,470,802 A | | 11/1995 | Gnade et al. ................ 438/781 |

(List continued on next page.)

OTHER PUBLICATIONS

S. R. Stiffler et al., The Effect of Trench Corner Shapes on Local stress Fields: A Three–Dimensional Finite–Element Modeling Study. IEEE 1993, pp. 557–563.*
M. Nandakumar et al., Shallow Trench Isolation for Advanced ULSI CMOS Technologies. IEDM 1998, pp. 133–135.*
Optimized Shallow Trench Isolation Structure and Its Process for Eliminating Shallow Trench Isolation Induced Parasitic Effects, IBM Technical Disclosure Bulletin, Apr. 1992, pp. 276–277.
Nanoscale CMOS, Wong, et al., Proceedings of the IEEE, vol. 87, No. 4, Apr. 1999.
Ohno, et al. Experimental 0.25–$\mu$m–Gate Fully Depleted CMOS/SIMOX Process Using a New Two–Step LOCOS Isolation Technique. IEEE Transactions on Electron Devices, vol. 42, No. 8, (Aug. 1995), pps. 1481–1486; retrieved from Internet IEEE Xplore Citation wysiwyg://10/ http://ieeexplore.ieee.org/...%2C=Y.%2C=M.%3b= Tsuchiya%2c=T.

*Primary Examiner*—Olik Chaudhuri
*Assistant Examiner*—Anh Duy Mai
(74) *Attorney, Agent, or Firm*—Renner, Otto, Boisselle & Sklar, LLP

(57) ABSTRACT

A method of isolation of active islands on a silicon-on-insulator semiconductor device, including steps of (1) providing a silicon-on-insulator semiconductor wafer having a silicon active layer, a dielectric insulation layer and a silicon substrate; (2) etching through the silicon active layer to form an isolation trench, the isolation trench defining an active island in the silicon active layer, the active island having at least one upper sharp corner; (3) rounding the at least one upper sharp corner of the active island, whereby at least one strained edge portion of the active island is formed; (4) removing at least a part of the at least one strained edge portion; and (5) at least partially filling the isolation trench with a dielectric trench isolation material to form a shallow trench isolation structure. An SOI wafer semiconductor device having a STI isolation structure free from a strained edge portion and a bird's beak.

16 Claims, 4 Drawing Sheets

U.S. PATENT DOCUMENTS

| | | | |
|---|---|---|---|
| 5,497,765 A | 3/1996 | Schwalke | |
| 5,516,710 A | 5/1996 | Boyd et al. | 438/309 |
| 5,569,058 A | 10/1996 | Gnade, et al. | 445/24 |
| 5,578,518 A | 11/1996 | Koike et al. | 438/424 |
| 5,599,722 A | 2/1997 | Sugisaka et al. | 438/406 |
| 5,641,711 A | 6/1997 | Cho | 438/763 |
| 5,646,053 A | 7/1997 | Schepis et al. | 435/402 |
| 5,683,075 A | 11/1997 | Gaul et al. | 257/510 |
| 5,741,740 A | 4/1998 | Jang et al. | |
| 5,783,476 A | 7/1998 | Arnold | 438/424 |
| 5,807,771 A | 9/1998 | Vu et al. | 438/154 |
| 5,837,612 A | 11/1998 | Ajuria et al. | 438/697 |
| 5,841,171 A | 11/1998 | Iwamatsu et al. | |
| 5,854,120 A * | 12/1998 | Urano et al. | 438/431 |
| 5,863,827 A | 1/1999 | Joyner | 438/424 |
| 5,872,044 A * | 2/1999 | Hemmenway et al. | 438/426 |
| 5,891,803 A | 4/1999 | Gardner | 438/660 |
| 5,911,109 A * | 6/1999 | Razouk et al. | 438/424 |
| 5,914,280 A | 6/1999 | Gelzinis | |
| 5,915,192 A | 6/1999 | Liaw et al. | 438/424 |
| 5,937,308 A * | 8/1999 | Gardner et al. | 438/424 |
| 5,976,948 A * | 11/1999 | Werner et al. | 438/424 |
| 5,981,402 A | 11/1999 | Hsiao et al. | 438/756 |
| 5,994,756 A | 11/1999 | Umezawa et al. | 257/510 |
| 6,002,160 A * | 12/1999 | He et al. | 257/513 |
| 6,025,269 A | 2/2000 | Sandhu | 438/688 |
| 6,046,106 A | 4/2000 | Tran et al. | 438/660 |
| 6,048,445 A | 4/2000 | Brain | 205/118 |
| 6,054,206 A | 4/2000 | Mountsier | 428/312.8 |
| 6,057,214 A | 5/2000 | Joyner | 438/424 |
| 6,074,931 A | 6/2000 | Chang et al. | 438/424 |
| 6,077,768 A | 6/2000 | Ong et al. | 438/622 |
| 6,096,612 A | 8/2000 | Houston | 438/424 |
| 6,096,621 A | 8/2000 | Jennings | 438/404 |
| 6,106,678 A | 8/2000 | Shufflebotham et al. | 204/192.32 |
| 6,110,793 A | 8/2000 | Lee et al. | 438/400 |
| 6,114,741 A | 9/2000 | Joyner et al. | 257/506 |
| 6,118,167 A | 9/2000 | DiSimone et al. | 257/510 |
| 6,118,168 A | 9/2000 | Moon et al. | 257/513 |
| 6,121,148 A | 9/2000 | Bashir et al. | 438/692 |
| 6,124,212 A | 9/2000 | Fan et al. | 438/709 |
| 6,127,242 A | 10/2000 | Batra et al. | 438/440 |
| 6,127,244 A | 10/2000 | Lee | 438/458 |
| 6,130,467 A | 10/2000 | Bandyopadhyay et al. | 257/506 |
| 6,136,713 A | 10/2000 | Chan et al. | 438/692 |
| 6,137,152 A | 10/2000 | Wu | 257/510 |
| 6,146,970 A | 11/2000 | Witek et al. | 438/424 |
| 6,147,402 A | 11/2000 | Joshi et al. | 257/751 |
| 6,150,234 A | 11/2000 | Olsen | 438/424 |
| 6,165,869 A | 12/2000 | Qian et al. | 438/424 |
| 6,171,917 B1 | 1/2001 | Sun et al. | 438/305 |
| 6,171,962 B1 | 1/2001 | Karlsson et al. | 438/692 |
| 6,174,785 B1 | 1/2001 | Parekh et al. | 438/424 |
| 6,268,268 B1 | 7/2001 | Tokushige | |
| 6,363,254 B1 | 3/2002 | Lee et al. | |
| 6,368,941 B1 | 4/2002 | Chen et al. | |

\* cited by examiner

METHOD FOR SHALLOW TRENCH ISOLATION WITH REMOVAL OF STRAINED ISLAND EDGES

RELATED APPLICATIONS

This application claims the benefit of and priority under 35 U.S.C. §119(e) to pending U.S. Provisional Application Ser. No. 60/278,107, filed Mar. 23, 2001.

TECHNICAL FIELD

The present invention relates to a method of manufacturing a semiconductor device comprising trench isolation. The invention has particular applicability in manufacturing high density semiconductor devices with submicron design features and active regions isolated by shallow isolation trenches.

BACKGROUND ART

Current demands for high density and performance associated with ultra large scale integration (ULSI) require submicron features of significantly less than 0.25 microns, increased transistor and circuit speeds and improved reliability. Such demands for increased density, performance and reliability require formation of device features with high precision and uniformity.

Conventional semiconductor devices comprise a substrate and various electrically isolated regions or islands, called active regions, active islands, or simply, islands, in which individual circuit components are formed. The electrical isolation of these active islands is typically accomplished by thermal oxidation of the semiconductor substrate, typically monocrystalline silicon or an epitaxial layer formed thereon, bounding the active islands. This type of isolation has been referred to as local oxidation of silicon, or LOCOS.

In an effort to enable the further reduction of the size of semiconductor devices, semiconductor-on-insulator (SOI) wafers increasingly have been used in very-large scale integration (VLSI) or ULSI of semiconductor devices. An SOI wafer typically has a thin layer of silicon on top of a layer of a dielectric insulator material. In SOI technology, the semiconductor device is formed entirely in and on the thin layer of silicon, and is isolated from the lower portion of the wafer by the layer of dielectric insulator material. In an SOI integrated circuit, essentially complete island or device isolation may be achieved using conventional device processing methods by surrounding each device, including the bottom of the device, with an insulator. One advantage which SOI wafers have over bulk silicon wafers is that the area required for isolation between islands or devices on an SOI wafer is less than the area typically required for isolation on a bulk silicon wafer. LOCOS isolation generally is not useful for SOI integrated circuits in VLSI and ULSI semiconductor devices, since it requires too large an area of silicon for oxidation.

Another type of isolation structure is known as trench isolation, wherein shallow isolation trenches are etched in the substrate between the sites of semiconductor devices and an oxide liner is thermally grown on the trench walls. The trench is then refilled with an insulating material. The resulting structure is referred to as a shallow trench isolation (STI) structure. STI has been widely applied to VLSI and ULSI semiconductor devices, and has been applied recently to SOI integrated circuits for such devices.

A typical method of trench formation comprises initially growing a pad oxide layer on the substrate. A nitride layer may be deposited over the pad oxide. A photoresist mask is then applied to define the trench areas. The exposed portions of the photoresist are removed, defining a pattern on the nitride layer or other layer. This layer is then etched, followed by etching of the exposed pad oxide layer. Further etching continues into the thus-exposed substrate to form the shallow trench. When etching of the trench is completed, the photoresist is stripped off the remaining nitride layer.

Next, the substrate is oxidized to form an oxide liner on the walls and base of the trench to control the silicon-silicon dioxide interface quality and to remove etching-induced damage. The trench is then refilled, such as by coating the entire surface of the semiconductor wafer, with an insulating material (or "trench fill"), such as an oxide, for example, silicon dioxide derived from tetraethyl orthosilicate (TEOS). When a nitride layer is present, the surface may then be planarized, as by chemical-mechanical polishing (CMP) using the nitride layer as a polish stop. In subsequent operations, the nitride and pad oxide are stripped off, and a gate oxide layer is grown on the exposed silicon of the substrate. Thereafter, the wafer is further processed to form a semiconductor device.

Trench isolation has several limitations, which may be exacerbated in SOI devices. One problem is that sharp corners at the top of the trench can result in junction leakage currents. More specifically, such sharp corners may cause unwanted increases in the sub-threshold currents in the channel regions along the edge of the device areas. The device threshold voltage can also be lowered. In order to avoid these problems, it has been found desirable to round the corners of such trenches to increase the radius of curvature and thereby decrease the electric field at the corners. This has been accomplished by, for example, oxidizing the entire inner surface of the newly formed trench, taking advantage of the fact that an exposed corner of a silicon layer oxidizes faster than a flat surface of the silicon layer, thus forming a rounded upper corner at the top of the trench.

However, with SOI devices, the corner rounding solution leads to a new problem. The new problem in SOI devices arises as a result of the proximity of the dielectric insulation layer below the silicon active layer. In SOI devices, the shallow isolation trench is etched through the silicon layer to the insulation layer. It is desirable and a common practice in the art to take advantage of the presence of the insulation layer beneath the silicon active layer to provide a well-controlled etch-stop for the silicon etch. When the exposed portion of the silicon on the sidewalls of the newly formed trench is oxidized during the process of rounding the corners, a wedge or "bird's beak" of new oxide forms on the underside of the silicon active layer adjacent the isolation trench, between the silicon active layer and the underlying layer of insulating material of the SOI wafer. Thus, as the oxide grows on the sidewalls of the trench, it may grow laterally between the lower edge of the silicon active layer and the underlying dielectric insulation layer. In essence, during the process of oxidation which is intended to round the upper corner of the silicon active layer, the lower corner of the silicon active layer is also rounded, forming the "bird's beak" or oxide wedge between the silicon active layer and the underlying dielectric insulation layer. The problem becomes manifest when, during subsequent high temperature processing steps, thermal expansion of the bird's beak creates strain-induced defects in the silicon crystal structure and/or lifts the silicon layer, due to the stress of the differently expanding oxide. The strain-induced defects in the crystal structure may change the electrical characteristics of the semiconductor. The lifting of the silicon layer distorts the surface of the semiconductor device from its desired planarity to an undesirable non-planar condition. As semiconductor device dimensions continue to become smaller, problems such as these both occur more easily and become less tolerable.

Thus, there exists a need for STI methodology applicable to SOI semiconductor devices wherein the problems resulting from sharp corners can be alleviated without creating the problems resulting from the bird's beak on the underside of the silicon active layer adjacent the isolation trench.

DISCLOSURE OF THE INVENTION

The present invention provides a method of avoiding formation of the bird's beak while providing rounded upper corners on the silicon active layer in shallow trench isolation of SOI semiconductor devices.

In one embodiment, the present invention relates to a method of isolation of active islands on a silicon-on-insulator semiconductor device, including steps of (1) providing a silicon-on-insulator semiconductor wafer having a silicon active layer, a dielectric insulation layer and a silicon substrate, in which the silicon active layer is formed on the dielectric insulation layer and the dielectric insulation layer is formed on the silicon substrate; (2) etching through the silicon active layer to form an isolation trench, the isolation trench defining an active island in the silicon active layer, the active island having at least one upper sharp corner; (3) rounding the at least one upper sharp corner of the active island, whereby at least one strained edge portion of the active island is formed; (4) removing at least a part of the at least one strained edge portion; and (5) at least partially filling the isolation trench with a dielectric trench isolation material to form a shallow trench isolation structure.

In one embodiment, the strained edge portion is removed by use of a highly directional, substantially vertical etch, using the hard mask layer as an etch mask. In another embodiment, the hard mask is first trimmed back, and then a highly directional, substantially vertical etch is applied, using the trimmed hard mask layer as an etch mask. In another embodiment, the hard mask is first trimmed back, an additional sidewall oxidation step is applied to further round the upper corner, and then a highly directional, substantially vertical etch is applied, using the trimmed hard mask layer as an etch mask.

In one embodiment, the present invention relates to a method of shallow trench isolation of active islands on a silicon-on-insulator semiconductor device, comprising the steps of (1) providing a silicon-on-insulator semiconductor wafer having a silicon active layer, a dielectric insulation layer and a silicon substrate, in which the silicon active layer is formed on the dielectric insulation layer and the dielectric insulation layer is formed on the silicon substrate; (2) forming a hard mask layer over the silicon active layer; (3) etching through the hard mask layer and the silicon active layer to form an isolation trench, the isolation trench defining an active island in the silicon active layer, the active island having at least one upper sharp corner; (4) rounding the at least one upper sharp corner of the active island to form at least one upper rounded corner, whereby at least one strained edge portion of the active island is formed; (5) trimming the hard mask layer; (6) removing at least a part of the at least one strained edge portion by etching away the at least one strained edge portion; and (7) filling the isolation trench with a dielectric trench isolation material to form a shallow trench isolation structure.

In another embodiment, the present invention relates to a silicon-on-insulator semiconductor device, comprising:

a silicon-on-insulator wafer having a silicon active layer, a dielectric isolation layer a silicon substrate, in which the silicon active layer is formed on the dielectric insulation layer and the dielectric insulation layer is formed on the silicon substrate; and at least one isolation trench through the silicon active layer defining an active island in the silicon active layer, the isolation trench filled with a trench isolation material;

wherein the at least one isolation trench includes an upper rounded corner in the silicon active layer and is substantially free of both a bird's beak on a lower side of the silicon active layer and a strained edge portion of the silicon active layer.

Thus, the present invention provides methods of STI applicable to SOI semiconductor devices which do not suffer from problems resulting from formation of a "bird's beak" on the underside of the silicon active layer adjacent the isolation trench, while still allowing formation of isolation trenches which provide for complete electrical isolation of adjacent active islands in the SOI wafer.

Figure 1:
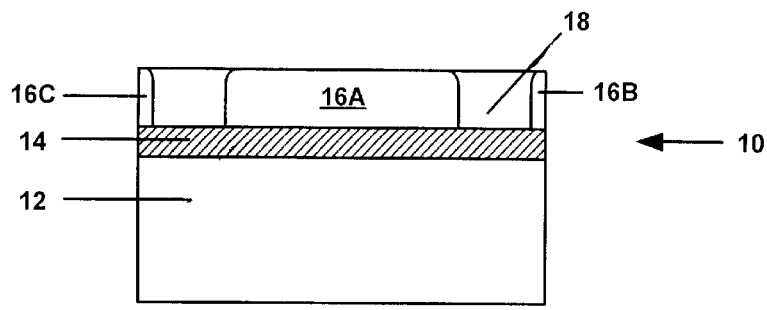
FIG. 1 is a partial cross-sectional view of one embodiment of an SOI wafer following formation of a shallow trench isolation structure, in accordance with the present invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

MODES FOR CARRYING OUT THE INVENTION

The method of the present invention may be applied to a silicon-on-insulator (SOI) semiconductor wafer at any time subsequent to the formation of the SOI wafer. In one embodiment, the method is applied following fabrication of the SOI wafer and prior to fabrication of the elements of a semiconductor device on the SOI wafer.

The present invention relates to an SOI wafer including a shallow trench isolation (STI) structure between active islands, in which the STI structure is formed of a trench isolation material, such as a dielectric material, for example, silicon dioxide. FIG. 1 is a partial cross-sectional view of an SOI wafer 10 following formation of a shallow isolation trench, in accordance with the present invention. The SOI wafer 10 shown in FIG. 1 includes a substrate 12, a dielectric insulation material layer 14 and a silicon active layer 16. The SOI wafer 10 further includes an STI structure 18 formed of a trench isolation material. As shown in FIG. 1, the silicon active layer 16 is formed on the dielectric insulation layer 14 and the dielectric insulation layer 14 is formed on the silicon substrate 12. Although only two STI structures 18 are shown in FIG. 1, the SOI wafer 10 may include a plurality of such structures. As shown in FIG. 1, the at least one isolation trench or structure 18 is formed so as to continue through the silicon active layer 16 to the underlying dielectric insulation layer 14. In this form, the isolation structure 18 defines an active island 16A in the silicon active layer 16. As will be described in more detail below, the isolation trench is filled with a trench isolation material, which is in contact with both the dielectric insulation layer and the silicon active layer.

As shown in FIG. 1, and described in more detail below, the isolation trench or structure 18 includes an upper rounded corner in the silicon active layer 16 and is free of both a bird's beak on a lower side of the silicon active layer and a strained edge portion of the silicon active layer. As described below, the bird's beak and the strained edge portion have been removed by a step of etching away the strained edge portion.

In the first step of the method of the present invention, an SOI semiconductor wafer having a silicon active layer, a dielectric insulation layer and a silicon substrate is provided. The silicon active layer is formed on the dielectric insulation layer and the dielectric insulation layer is formed on the silicon substrate. In one embodiment, the silicon active layer is a monocrystalline silicon. As used herein, the term "monocrystalline" means a crystal lattice structure substantially without defects in the crystal structure and containing few impurities. The SOI wafer may be formed by any technique known in the art for forming such wafers.

Figure 2:
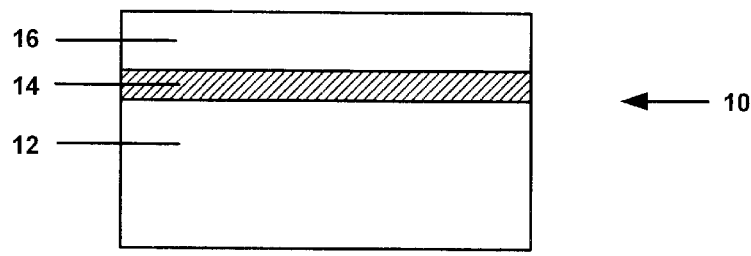
FIG. 2 is a partial cross-sectional view of an SOI wafer.

FIG. 2 shows a partial cross-sectional view of the SOI wafer 10, with the silicon substrate 12, the buried oxide layer 14 and the silicon active layer 16, prior to formation of a shallow trench isolation structure. The silicon active layer 16 may include one or more semiconductor devices. In one embodiment, the silicon active layer 16 is part of a newly fabricated SO wafer, in which semiconductor devices have not yet been fabricated. In one embodiment, the silicon active layer 16 is part of an SOI wafer in which a plurality of semiconductor devices have been formed, or are in the process of being formed. For example, the silicon active layer 16 may have been implanted with n- or p-dopants. In such embodiment, the silicon active layer 16 includes at least one semiconductor device element. The partial SOI wafer shown in FIG. 2 is only a small portion of a much larger SOI wafer, of which the silicon active layer 16 will be divided into a plurality of active islands, which may be isolated one from another by application of the method of the present invention. As will be understood by those of skill in the art, the drawings and descriptions herein depict a cross-sectional view of a single active island and two island-defining isolation structures. The presently disclosed method is applicable to formation of a plurality of such isolation structures simultaneously.

In one embodiment, the substrate 12 is silicon. In one embodiment, the substrate 12 is n- or p-doped silicon. The substrate 12 may be any material known in the art for use as a substrate in an SOI wafer.

In one embodiment, the dielectric insulation layer 14 is an oxide of silicon. In one embodiment, the dielectric insulation layer 14 is silicon dioxide. The dielectric insulation layer 14 may be any material known in the art for use as a dielectric insulation layer in an SOI wafer.

In one embodiment, the silicon active layer 16 is monocrystalline silicon. In one embodiment, the silicon active layer 16 is n- or p-doped silicon. In one embodiment, the silicon active layer 16 is n- or p-doped monocrystalline silicon. The silicon active layer 16 may include additional semiconductor device elements.

The SOI wafer 10 used in the present invention may be an SO wafer formed by any method known in the art for forming SOI wafers. The present invention, as described herein, is broadly applicable to any SOI wafer. The method of the present invention may be applied to a previously formed SOI wafer, and thus is not limited to any particular method of forming the SOI wafer, and is not limited to any particular type of SOI wafer. In one embodiment, for example, the SOI wafer may be a silicon-on-sapphire wafer.

Figure 3:
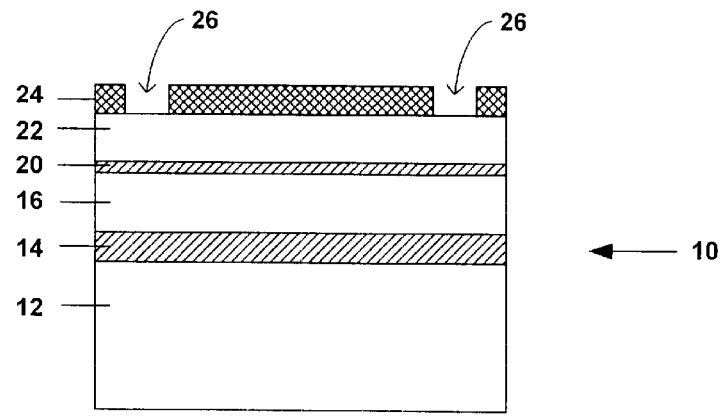
FIG. 3 is a partial cross-sectional view of an SOI wafer following application of a pad oxide layer, a hard mask layer and a patterned photoresist layer, in accordance with the present invention.
Figure 4:
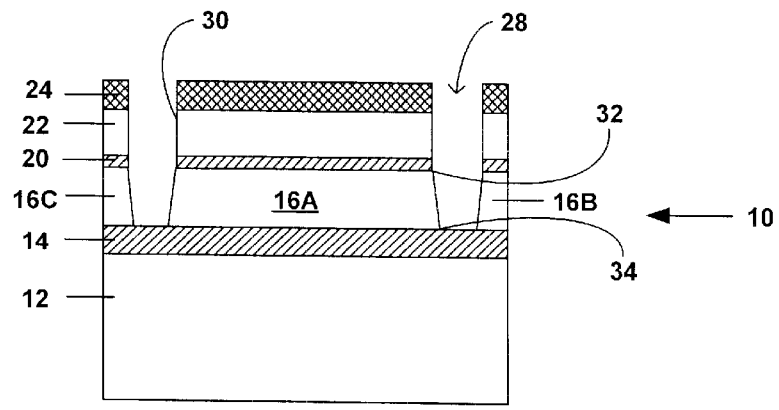
FIG. 4 is a partial cross-sectional view of the SOI wafer of FIG. 3 following one or more steps of etching to form an isolation trench, in accordance with the present invention.

In the second step of the method of the present invention, an isolation trench is formed through the silicon active layer. By forming the isolation trench, at least one active island is defined in the silicon active layer. The isolation trench may be formed by a series of etching steps which are conventional, as will be recognized upon review of FIGS. 3–4. The following description relating to the steps of forming the isolation trench as illustrated in FIGS. 3–4 is merely exemplary. The step(s) of forming the isolation trench may be carried out by any known method for forming shallow isolation trenches. The method of the present invention is not limited to any particular process for forming the trench.

In one embodiment, the step of forming the isolation trench includes forming a pad oxide layer 20 as shown in FIG. 3 on the surface of the SOI wafer 10, which may be the surface of the silicon active layer 16. The pad oxide layer 20 serves to cushion the transition of stresses between the silicon active layer 16 and subsequently deposited layers, such as a hard mask layer. In forming the pad oxide layer 20, which may also be referred to as a buffer oxide, a silicon dioxide ($SiO_2$) layer may be thermally grown on the surface of the SOI wafer 10. The pad oxide layer 20 may be formed by other known deposition methods. For example, the pad oxide layer 20 may be deposited by an alternative technique such as by chemical vapor deposition (CVD) or by a plasma-assisted deposition method.

In one embodiment, the step of forming an isolation trench includes forming a hard mask layer 22 as shown in FIG. 3, such as a layer of silicon nitride ($Si_3N_4$) on the pad oxide layer 20. In an embodiment in which the hard mask layer 22 is a silicon nitride hard mask layer, it may be formed by any known technique, such as by a plasma deposition or a CVD method. The hard mask layer 22 may be formed of other known hard mask materials, which may be formed by known techniques. The hard mask layer 22 serves to protect the underlying structural elements and to provide a base upon which an etch mask layer, such as a photoresist layer, may be deposited. The hard mask layer 22 may also function as an anti-reflective coating (ARC).

In one embodiment, the step of forming an isolation trench includes forming a photoresist layer 24, as shown in FIG. 3, on the hard mask layer 22. This step includes patterning and developing the photoresist layer 24 into a predetermined resist pattern. This step may include forming the selected pattern by lithography, and thereafter developing the photoresist layer 24 to leave the selected pattern on the surface of the SOI semiconductor wafer 10, e.g., on the hard mask layer 22. The photoresist layer 24 shown in FIG. 3 includes an opening or space 26 which schematically illustrates a gap in the photoresist pattern, and corresponds to a location at which the isolation trench will be formed in subsequent steps. In one embodiment, the pattern selected forms a pattern for isolation of the active islands upon which a plurality of semiconductor devices will subsequently be formed on the SOI semiconductor wafer 10.

When the selected pattern has been formed in the photoresist layer 24, and the photoresist developed, the SOI wafer 10 can then be etched to form the at least one isolation trench. In one embodiment, the etching is an anisotropic etch, in which the etching takes place in the downward direction (downward from the silicon active layer 16 towards the substrate 12 in, e.g., FIG. 3), but substantially less or not in a lateral direction. In one embodiment, the etching step to form the isolation trench is by reactive ion etching (RIE).

An isolation trench 28 is shown in FIG. 4. The isolation trench 28, together with other similar isolation trenches, forms and defines a plurality of active islands, exemplified by active islands 16A, 16B and 16C, in the silicon active layer 16 shown in FIG. 4.

Any method known in the art for etching the various layers which have been applied over the silicon active layer 16 of the SOI wafer 10 may be used to form the isolation trench 28, and thereby define the active island 16A. Thus, for example, a series of etching steps may be used, to etch first through the hard mask layer 22, then through the pad oxide layer 20, and finally through the silicon active layer 16.

In one embodiment, the etching step of the present invention penetrates through the silicon active layer to the underlying dielectric insulation layer, in forming the isolation trench 28, as shown in FIG. 4. In one embodiment, the etching step penetrates through the silicon active layer 16 across the entire width of the isolation trench 28, leaving none of the original silicon of the silicon active layer in the isolation trench 28, in forming the isolation trench 28. The etching step may penetrate not only through the silicon active layer 16 but also slightly into the underlying dielectric insulation layer 14, in forming the isolation trench 28. Although the etching reaches or etches into the dielectric insulation layer 14, it should not penetrate through the layer 14. In one embodiment, the etching step does not reach the underlying dielectric insulation layer 14 across the full width of the isolation trench 28. However, in order to assure complete isolation of each of the plurality of active islands, e.g., the active islands 16A, 16B and 16C, one from another, the etching step to form the isolation trench 28 should reach the underlying dielectric insulation layer 14 across at least a portion of the width along the entire length of the isolation trench 28. In other words, while the trench may not reach the dielectric insulation layer 14 across its full width, there should be no semiconductor connection (i.e., the original silicon of the silicon active layer 16) remaining in contact with, or forming a contact between, opposite sides of the isolation trench 28. The etching step to form the isolation trench 28 should reach the underlying dielectric insulation layer 14 across its entire width along its entire length.

The isolation trench 28 embodiment illustrated in FIG. 4 includes sidewalls 30 having an angle in the range from about 65° to about 85° from the horizontal. As known by those of skill in the art, such sidewalls are preferably formed at an angle in this range. In other embodiments, the sidewalls 30 may be formed at an angle outside this range, due to variations in the etching process, as would be recognized by those of skill in the art.

Once the isolation trench 28 has been formed, the photoresist layer 24 may be removed. In one embodiment, the hard mask layer 22 is removed at this time, in addition to removing the photoresist layer 24. In another embodiment, the hard mask layer 22 is retained for subsequent use as an etch mask layer, as described more fully below.

In the third step of the method of the present invention, at least one corner of the active island in an upper portion of the silicon active layer is rounded. Corner rounding has been found useful in avoiding undesired electronic effects resulting from sharp corners in the silicon active layer 16.

The terms "sharp" or "substantially sharp" as used herein refer to corners of the silicon active layer 16 immediately following the step of etching through the silicon active layer to form an isolation trench. At that time the corners are relatively sharp and angular, and have a generally sharply angled, squarish appearance, as opposed to a round or rounded appearance. It should be recognized that the corners may depart from exact orthogonality (i.e., a sidewall at an angle of 90° from the horizontal), due to the angle at which the sidewalls are formed, i.e., from about 65° to about 85° from the horizontal. The sharp or substantially sharp corner is further defined as a corner which is sufficiently sharp that the sharpness of the corner results in the unwanted electronic effects described herein. Thus, a sharp corner is one that causes the unwanted electronic effects.

The terms "round" or "rounding" or "rounded" as used herein refer to the changed shape of one or more corners of the silicon active layer 16 from a condition in which the corner is relatively sharp, described as square or substantially square as defined above, to a condition in which the corner has been rounded or otherwise rendered not square, so that the undesired electronic effects are not observed. Thus, a rounded corner is further defined as a corner which has been rounded to a degree sufficient to avoid substantially the unwanted electronic effects described herein. Thus, a rounded corner is one that does not cause the unwanted electronic effects.

Rounding of the corners may include actual rounding, in which the corner is changed to have a radius of curvature, i.e., to include a "curved corner" having a regular curve. Rounding of the corners may include rounding in which the corner has an uneven, irregular curve such as an ellipsoid curve. Rounding of the corners may include chamfering, in which the corner is changed to have a chamfered face, and may include multiple chamfers, in which the corner is changed to have a series of chamfered faces, i.e., a "polygonal corner". The exact shape of the rounded corner is less important than is the absence of the unwanted electronic effects described herein.

As shown in FIG. 4, the newly etched isolation trench 28 includes an upper sharp corner 32 and a lower sharp corner 34 in the active islands, e.g., 16A, 16B and 16C. If the upper sharp corner 32 is not rounded, the sharpness of the upper sharp corner 32 may result in undesired electronic effects in the active island, as known in the art and described in the above background section. Thus, it is desirable that the upper sharp corner 32 be rounded.

In one embodiment, an upper rounded corner 36 is formed by oxidation of the silicon of the silicon active layer, in which the upper sharp corner of the silicon active layer becomes rounded. This oxidation causes the rounding of sharp corners because the oxidation proceeds more rapidly at a corner than at a flat surface such as the sidewall of the isolation trench.

Figure 5:
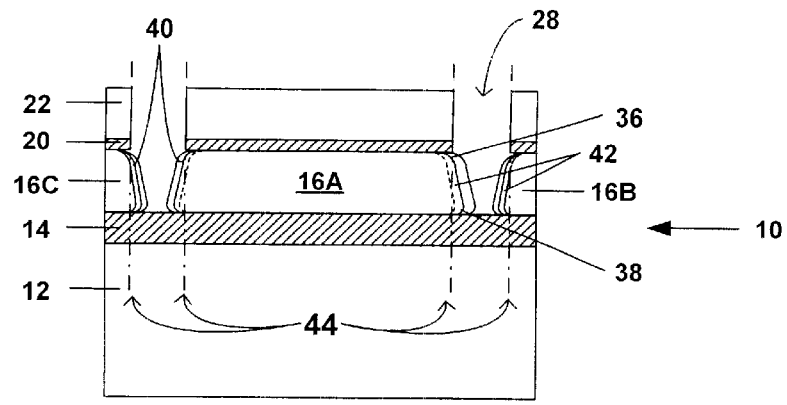
FIG. 5 is a partial cross-sectional view of the SOI wafer of FIG. 4 following a step of corner rounding in the active island, including formation of a strained edge portion of the active island, in accordance with the present invention.

FIG. 5 is a partial cross-sectional view of the SOI wafer of FIG. 4 following a step of corner rounding in the active island, including formation of a strained edge portion of the active island, in accordance with the present invention.

As shown in FIG. 5 (and in FIGS. 6 and 7), the upper rounded corner 36 has been formed from the sharp corner 32 of the active islands 16A, 16B and 16C shown in FIG. 4. However, in addition, the lower sharp corner 34 has been rounded to form a bird's beak 38, as shown in FIG. 5, on the lower sides of the active island 16A. If allowed to remain, the bird's beak 38 may cause stress in the active island 16A, with resultant changes in crystal structure and electronic properties. In extreme cases, the bird's beak 38 may result in the active island 16A becoming misshapen or deformed. The effects of the bird's beak 38 result in the formation of a strained edge portion, as described more fully below.

In one embodiment, the step of rounding corners is carried out by a thermal oxidation of exposed silicon surfaces of the active islands at a temperature in the range from about 800° C. to about 1000° C. in an oxygen-containing atmosphere. In one embodiment, the thermal oxidation results in rounding the upper sharp corners 32 to a greater extent than the lower sharp corners are rounded.

In one embodiment, the rounded corner is formed by a reaction other than oxidation. Other agents known in the art which etch or otherwise react with the silicon of the silicon active layer 16 may be employed. In one embodiment, the upper rounded corner 36 is formed by a reaction other than a thermal oxidization. Other methods known in the art for oxidizing the silicon of the silicon active layer 16 to round corners may be employed. Such other agents include, for example, chlorine together with oxygen, as described in U.S. Pat. No. 6,150,234. Any method known in the art for rounding such corners may be employed in the method of the present invention. Oxidation is generally preferred, since it forms an insulating dielectric material for a sidewall oxide layer, which need not be removed prior to filling of the trench.

Figure 6:
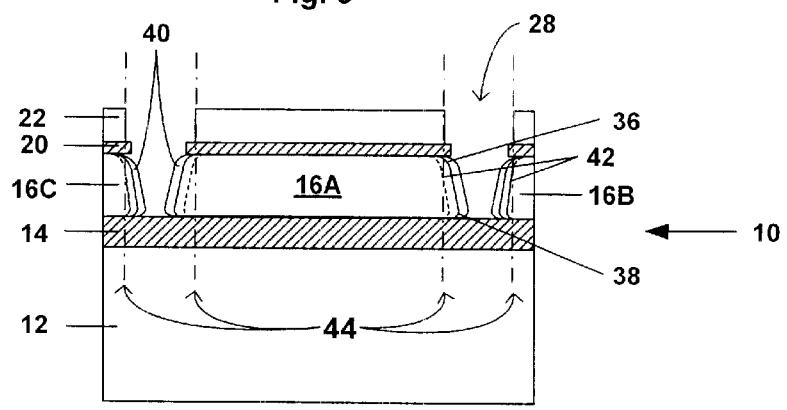
FIG. 6 is a partial cross-sectional view of the SOI wafer of FIG. 5 following a step of trimming the hard mask, in accordance with an embodiment of the present invention.
Figure 7:
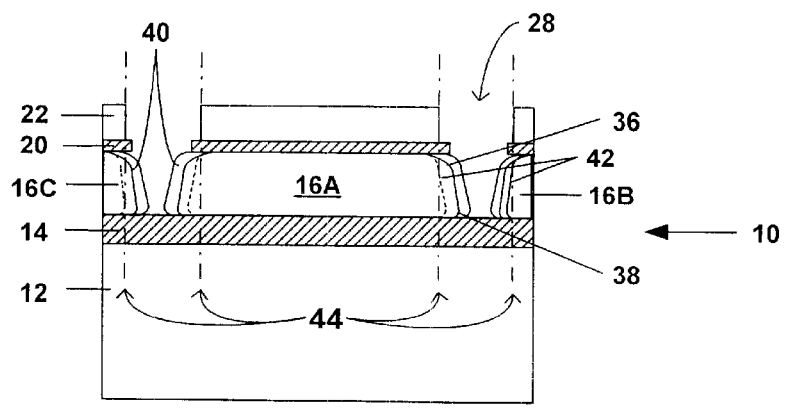
FIG. 7 is a partial cross-sectional view of the SOI wafer of FIG. 6 following a step of trimming the hard mask and an additional step of sidewall oxidation, in accordance with another embodiment of the present invention.

While the corners are illustrated in FIGS. 5–7 as smoothly rounded, the scope of the invention is not so limited to any particular "rounded" corner. As described above, the step of rounding the corner may produce an upper rounded corner 36 having a variety of shapes, with the only proviso being that the upper rounded corner 36 not cause the disfavored electronic effects which would result if the upper sharp corner 32 was allowed to remain in the SOI wafer 10.

In an embodiment in which the rounding step produces "round", i.e., curved rather than polygonal, rounded corners 36, the radius of curvature should be at least about 10 nm for an SOI wafer 10 having a silicon active layer 16 which is 100 nm thick. In an embodiment in which the rounding step produces polygonal rounded corners 36, a theoretical radius of curvature, approximated by drawing an arc connecting the intersections of the sides of the polygon is at least about 20 nm for a 100 nm thick silicon active layer 16. In one embodiment, the radius of curvature is in the range from about 20 nm to about 50 nm for a 100 nm thick silicon layer. In one embodiment, the radius of curvature is in the range from about 30 nm to about 60 nm for a 100 nm thick silicon active layer 16. For reasons relating to subsequent steps in the method of the present invention, it may be beneficial to increase the radius of curvature to the range of 30 nm to 75 nm. The radius of curvature is dependent of the method used to generate the rounding. The radius of curvature is scalable, is relative to the thickness of the silicon active layer 16, and will continue to change as device dimensions become smaller.

In one embodiment, the step of rounding corners includes formation of an oxide of the silicon exposed on the sidewalls of the isolation trench 28, shown in FIGS. 5–7 as sidewall oxide layer 40. The sidewall oxide layer 40 is shown in FIGS. 5–7 as extending laterally outward from the edge of the original silicon of the silicon active layer 16, which schematically illustrates the fact that when silicon dioxide is formed by oxidation of a given quantity of silicon, the silicon dioxide has a larger volume than the original silicon. Formation of the sidewall oxide 40 results in smoothing any rough or uneven areas in the sidewall 30.

In one embodiment, formation of the bird's beak 38 results in formation of at least one strained edge portion 42 in the vicinity of the upper rounded corner 36 and the bird's beak 38. As indicated above, the strained edge portion 42 results from stresses originating in the bird's beak 38. The strained edge portion 42 is schematically indicated in FIGS. 5–7 by a dashed-line circle in the vicinity of the upper rounded corner 36 and the bird's beak 38, in the active islands 16A, 16B and 16C. The actual extent of the strained edge portion 42 may be more or less than that schematically shown in FIGS. 5–7. The actual extent of the strained edge portion 42 may not become manifest until after subsequent fabrication steps in forming an SOI semiconductor device. The size of the strained edge portion 42 may be estimated based on prior experience with a particular SOI wafer type and corner rounding method, or by sampling and analysis of individual SOI wafers.

In one embodiment, the upper sharp corner 32 and the lower sharp corner 34 are rounded differentially. In one embodiment, the differential rounding results in rounding of the upper sharp corner 32 to a greater degree than the rounding of the lower sharp corner 34. Although not to be bound by theory, it is thought the differential rounding may be due to physical parameters which limit access of the oxidizing medium to the lower sharp corner 34. The differential rounding is of particular benefit in the present invention, since a subsequent step of removing a strained edge portion may be expected to remove some portion of the rounded corners. If the upper rounded corner 36 is rounded to a greater degree, i.e., has a greater radius of curvature, than the lower rounded corner (the bird's beak 38), the step of removing the strained edge portion may be controlled so as to leave a rounded portion of the upper rounded corner 36 while eliminating all or substantially all of the bird's beak 38. Thus, in one embodiment of the present invention, the upper sharp corner 32 is rounded to a significantly greater degree than is the lower sharp corner 34, such that on subsequent removal of the strained edge portion 42, a rounded upper corner 36 remains, while the bird's beak 38 is removed along with the strained edge portion 42. In such embodiment, the radius of curvature of the rounded upper corner 36 may exceed 200 nm, and may be in the range from about 200 nm to about 400 nm. In one embodiment, the radius of curvature of the bird's beak 38 may be less than about 100 nm, and may be in the range from about 50 nm to about 100 nm. As described below in more detail, a ratio of the radius of curvature of the upper rounded corner to the lower rounded corner may be, for example, 2 or 3. The ratio of the radii of curvature is the more significant factor, since as device dimensions continue to be reduced, the absolute radii will be reduced apace. For this reason, and for the reasons set forth below, the ratio of the radii of curvature becomes important.

In the fourth step of the method of the present invention, at least a portion of the at least one strained edge portion 42 is removed. In one embodiment, the strained edge portion is removed by being etched away. The etching may be by any suitable method known in the art. In one embodiment, the silicon of the strained edge portion 42 is etched by a reactive ion etching.

FIGS. 5, 6 and 7 show three embodiments of the step of removing at least a part of the strained island edge portions which were formed as a result of the rounding step. Referring first to FIG. 5, the SOI wafer 10 includes the hard mask layer 22 in the condition in which it was formed during the trench etching steps. In one embodiment, the step of removing at least a part of the strained island edge portion 42 uses the hard mask layer 22 in this condition as an etch mask. In this embodiment, a highly anisotropic, substantially vertical etching method is used. Such methods include reactive ion etching, for example. Any suitable highly anisotropic method may be used. As shown in FIG. 5, a set of vertical dashed lines 44 show the approximate shape of the boundaries of the etch for each of the trenches 28. In this embodiment, the SOI wafer 10 is etched in a manner which removes a significant portion of the strained edge portions 42, but may leave a small amount of the strained edge portion. This embodiment leaves a well rounded corner 36.

Referring now to FIG. 6, which is a partial cross-sectional view of the SOI wafer of FIG. 5 following a step of trimming the hard mask, another embodiment of the present invention is described. As shown in FIG. 6, the SOI wafer 10 includes the hard mask layer 22, but prior to the step of removing the strained edge portions, the hard mask layer 22 is trimmed. The trimming step may be carried out by any method which is appropriate for the material (e.g., silicon nitride, silicon-rich silicon nitride or silicon oxynitride) of which the hard mask layer 22 is formed. As shown by comparison of FIG. 6 with FIG. 5, the size of the hard mask layer 22 has been reduced, in both its horizontal and vertical extent. In this embodiment, the step of removing at least a part of the strained island edge portion 42 uses the trimmed hard mask layer 22 as an etch mask. In this embodiment, a highly anisotropic, substantially vertical etching method is used, as described for the embodiment of FIG. 5. As shown in FIG. 6, a set of vertical dashed lines 44 show the approximate shape of the boundaries of the etch for each of the trenches 28. In this embodiment, the SOI wafer 10 is etched in a manner which removes a significant portion, and in one embodiment, substantially all, of the strained edge portions 42. In this embodiment, no more than a very small amount of the strained edge portion remains, and in one embodiment, substantially none of the strained edge portion remains. This embodiment leaves a slightly rounded corner 36.

Referring now to FIG. 7, which is a partial cross-sectional view of the SOI wafer of FIG. 6 following a step of trimming the hard mask and an additional step of sidewall oxidation, another embodiment of the present invention is described. As shown in FIG. 7, the SOI wafer 10 includes the hard mask layer 22, but prior to the step of removing the strained edge portions, the hard mask layer 22 is trimmed, as described above with reference to FIG. 6. The trimming step may be carried out as described above. As shown by comparison of FIG. 7 with FIG. 5, the size of the hard mask layer 22 has been reduced, in both its horizontal and vertical extent. In this embodiment, the step of removing at least a part of the strained island edge portion 42 uses the trimmed hard mask layer 22 as an etch mask, as in the embodiment described with reference to FIG. 6. In this embodiment, a highly anisotropic, substantially vertical etching method is used.

In one embodiment, after the hard mask layer 22 has been trimmed, but before the step of removing the strained edge portions, an additional etch step may be introduced to remove the pad oxide layer 20 below the portion of the nitride hard mask layer 22 which was trimmed away. The additional etch step may expose a portion of the silicon active layer 16, which was previously covered by the pad oxide layer 20. In order to "re-round" the upper corners and to oxidize the exposed portion of the silicon, a further oxidation of the silicon sidewalls may be carried out. This additional oxidation "re-rounds" the upper corners 36 of the silicon active layers 16A, 16B and 16C, to compensate for any loss which may have occurred during the step of trimming the hard mask layer 22 and which may occur during the subsequent step of removing the strained edge portions. The "re-rounding" rounds the upper corners 36 to an extent greater than the extent of the bird's beak on the lower corner 38. The additional oxidation step may be carried out as described above for the sidewall oxidation.

When the additional oxidation step is completed, the step of removing the strained edge portions 42 is carried out, as described above for the embodiments of FIGS. 5 and 6. As shown in FIG. 6, a set of vertical dashed lines 44 show the approximate shape of the boundaries of the etch for each of the trenches 28. In this embodiment, the SOI wafer 10 is etched in a manner which removes a significant portion, and in one embodiment, substantially all, of the strained edge portions 42. In this embodiment, no more than a very small amount of the strained edge portion remains, and in one embodiment, substantially none of the strained edge portion 42 remains. This embodiment leaves a well rounded corner 36, due to the additional sidewall oxidation.

The step of removing the strained edge portion 42 maybe carried out by any appropriate etching method. In one embodiment, the etching is anisotropic and results in formation of vertical sidewalls in the isolation trench 28. In one embodiment, the etching is highly directional, resulting in formation of substantially vertical sidewalls in the isolation trench 28, with the hard mask layer 22 acting as the etch mask for this etching step.

Figure 9:
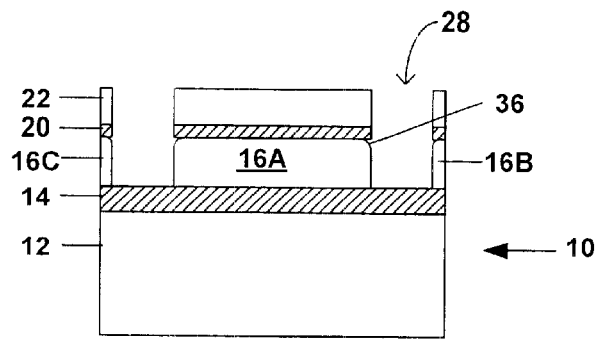
FIG. 9 is a partial cross-sectional view of one embodiment of the SOI wafer of FIG. 5 following a step of removing at least a part of the strained edge portion, in accordance with an embodiment of the present invention.

As shown in FIG. 9, as a result of the etching away of the strained edge portion 42 and of the overlying pad oxide layer 20 as guided by the hard mask 22, the lateral extent or width of the isolation trench 28 increases substantially in accord with the hard mask layer 22. Thus, in one embodiment, the width of the trench 28 following the fourth step of the present invention is defined by the hard mask layer 22. In one embodiment, the hard mask layer 22 is etched back from its defined location which resulted from the first trench etch step, and in one embodiment, the hard mask 22 is not etched back, but is retained at the size determined by the first etch step described above.

Any method known in the art for etching the various layers which have been applied over the silicon active layer 16 of the SOI wafer 10 may be used to etch away the strained edge portion 42 of the active island 16A. In one embodiment, a series of etching steps is used, to etch first through the hard mask layer 22, then through the pad oxide layer 20, and finally through, thereby to remove, the strained edge portion 42. The etching steps may take place sequentially.

In one embodiment, the etching step to remove the strained edge portion 42 also removes the sidewall oxide layer 40. In one embodiment (not shown), the etching step to remove the strained edge portion 42 also penetrates into, but not through, the underlying dielectric insulation layer 14. In one embodiment, the isolation trench 28 formed in the etching step to remove the strained edge portion 42 removes substantially all of the strained edge portion 42. In one embodiment, a small amount of the strained edge portion 42 remains. In an embodiment in which a small portion of the strained edge portion 42 remains after the etching step, the strain may be removed by a subsequent annealing step.

In one embodiment, the step of etching away the strained edge portion 42 results in the formation of an active island 16A retaining at least a portion of the upper rounded corner 36, while the bird's beak 38 is removed, as shown in FIG. 9. In this embodiment, this desired result is obtained since the extent of rounding of the upper sharp corner 32 in the rounding step is greater than the extent of rounding of the lower sharp corner 34, which rounding gave rise to the bird's beak 38. As noted above, it is thought that the degree of rounding of the upper sharp corner 32 exceeds the degree of rounding of the lower sharp corner 34 because the upper sharp corner 32 is more accessible to the oxidation conditions, including available oxygen, than is the lower sharp corner 34. Thus, in this embodiment, the oxidation or other reaction by which the upper rounded corner 36 is formed proceeds to a greater degree on the upper sharp corner 32 than on the lower sharp corner 32 by which the bird's beak 38 is formed.

In another embodiment, when the additional oxidation step described above with respect to the embodiment of FIG. 7 is used, the upper rounded corner 36 will be rounded to a greater degree than that shown in FIG. 9.

Figure 8A:
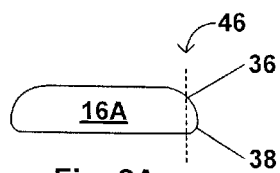
FIGS. 8A and 8B are partial cross-sectional views of embodiments of an SOI wafer in which upper and lower corners of the active island have been differentially rounded.
Figure 8B:
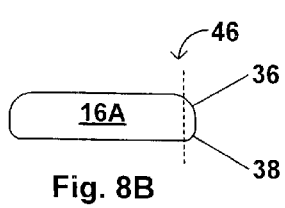

FIGS. 8A and 8B are partial cross-sectional views of embodiments of the active island 16A of an SOI wafer in which both upper and lower corners 32 and 34 of the active island 16A have been differentially rounded in the step of rounding the at least one upper corner of the active island 16A. FIGS. 8A and 8B include a dashed line 46 which schematically represents an etch-back limit or endpoint of the step of removing at least a part of a strained edge portion 42, when the strained edge portion 42 is removed. FIG. 8A shows an embodiment of the active island 16A in which the radius of curvature of the upper rounded corner 36 is about 3 times larger than the radius of curvature of the bird's beak 38. As shown in FIG. 8A, when the strained edge portion 42 is removed, e.g., by etching, back to the limit indicated by the line 46, substantially all of the bird's beak is removed, while a portion of the upper rounded corner 36 remains. Thus, when the radius of curvature of the upper rounded corner 36 is three times larger than that of the bird's beak, removal of the strained edge portion 42 results in an active island with a rounded upper corner 36.

FIG. 8B shows an embodiment of the active island 16A in which the radius of curvature of the upper rounded corner 36 is about 2 times larger than the radius of curvature of the bird's beak 38. As shown in FIG. 8B, when the strained edge portion 42 is removed, e.g., by etching, back to the limit indicated by the line 46, substantially all of the bird's beak is removed, while a portion of the upper rounded corner 36 remains. Thus, even when the radius of curvature of the upper rounded corner 36 is two times larger than that of the bird's beak, removal of the strained edge portion 42 results in an active island with a rounded upper corner 36.

In one embodiment, as a result of the difference in the radius of curvature of the upper rounded corner 36 and that of the bird's beak 38, when the removing of the strained edge portion is carried out, at least a portion of the upper rounded corner 36 remains, while substantially all of the bird's beak 38 on the lower corner is removed, as shown in FIG. 9. FIG. 9 shows an embodiment of the SOI wafer 10 in which the step of removing at least a part of the at least one strained edge portion 42, the bird's beak 38 has been substantially completely removed, while a portion of the upper rounded corner 36 remains. Thus, the undesirable electronic effects of a sharp upper corner 32 on the silicon active layer of the active island are avoided.

Figure 10:
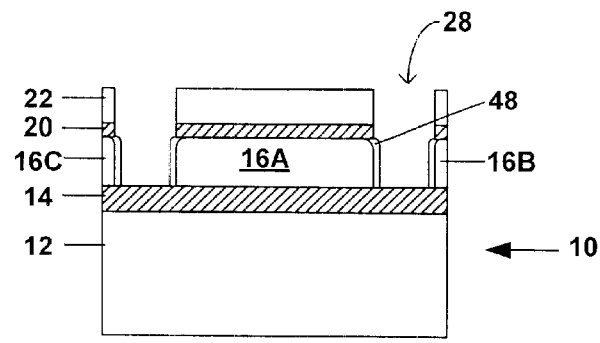
FIG. 10 is a partial cross-sectional view of another embodiment of the SOI wafer of FIG. 5 following steps of removing at least a part of the strained edge portion, in which rounded corners remain on the upper corners of the active island, and of forming a sidewall oxide liner, in accordance with the present invention.

In one embodiment, shown in FIG. 10, following the step of removing at least a part of the strained edge portion 42, a step of forming a sidewall oxide liner follows the removing step. FIG. 10 is a partial cross-sectional view of an embodiment of the SOI wafer following a step of removing at least a part of the strained edge portion, in which rounded corners remain on the upper corners of the active island, and following a step of forming a sidewall oxide liner. In the step of forming a sidewall oxide liner, newly exposed silicon of the silicon active layer 16 (exposed by the step of removing at least a part of the at least one edge portion) is oxidized to form a trench sidewall oxide liner 48 on the sidewalls of the isolation trench 26. In one embodiment, the sidewall oxide liner 48 comprises an oxide of silicon. In one embodiment, the sidewall oxide liner 48 is silicon dioxide. In one embodiment, not shown, in which the originally formed sidewall oxide layer 40 was not removed in the step of removing at least a part of the strained edge portion 42, the step of forming a sidewall oxide liner forms the sidewall oxide liner 48 which fills a gap formed by the removing step, the gap being between the newly exposed silicon and the remaining sidewall oxide layer 40.

In one embodiment (not shown), the step of filling the isolation trench 28 takes place in two steps, with a step of rounding the upper corners of the active islands 16A, 16B and 16C interposed between the filling steps. In an embodiment in which the step of removing the strained edge portion 42 of the active island 16A resulted in the loss of an excessive amount of the upper rounded corner 36 while removing the strained edge portions 42, it may be helpful to "re-round", or repeat the rounding of, the upper corner 36. Such rounding may be by the same method originally used, or may take place under milder conditions. The lower sharp corner resulting from the removal of the bird's beak 38 will not be affected by such a re-rounding step, since it will have been covered by the trench isolation material 50 in the first, partial filling step. The step of re-rounding the upper rounded corners 36 may be an oxidation, such as described previously, for use in the initial step of rounding the corners. Following the re-rounding step, the remaining unfilled portion of the isolation trench 28 is filled as described above. The re-rounding step may be considered remedial, in case the step of removing the strained edge portion removed too much material, i.e., the rounded corner 36.

In the fifth step of the method of the present invention, the isolation trench is at least partially filled with a trench isolation material. The trench isolation material may be any material known in the art for use as an isolation material for shallow trench isolation in semiconductor devices. The present method is not limited to any particular trench isolation material.

Figure 11:
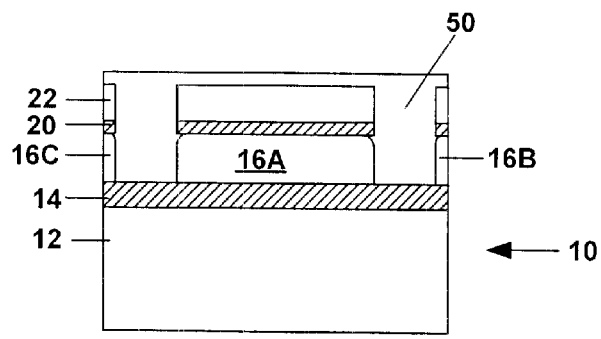
FIG. 11 is a partial cross-sectional view of an embodiment of an SOI wafer following a step of filling the isolation trench with a trench isolation material, in accordance with the present invention.

As shown in FIG. 11, in one embodiment, a trench isolation material 50 is formed so as to fill the isolation trench 28 from a level beginning at the upper surface of the dielectric insulation material 14 to a level above the silicon active layer 16, the pad oxide layer 20 and the hard mask layer 22. In one embodiment, not shown, the isolation trench 28 is filled with the trench isolation material 50 at least to a level above the upper surface of the silicon active layer 16. In one embodiment, the step of filling applies a layer of an oxide insulating material over the entire surface of the SOI wafer 10, including completely filling the isolation trench 28, thereby forming the trench isolation material 50. In the embodiment shown in FIG. 11, the hard mask layer 22 has been retained on the SOI wafer 10 during the step of filling the isolation trench 28. As noted above, in another embodiment, the hard mask layer 22 may be removed prior to the step of filling the trench 28.

The trench isolation material 50, shown in FIG. 11, may be formed of any material known in the art. In one embodiment, the trench isolation material 50 is an oxide. In one embodiment, the trench isolation material 50 is an oxide of silicon. In one embodiment, the trench isolation material 50 is silicon dioxide, $SiO_2$. The trench isolation material may comprise other dielectric materials, which can provide the function of electrically isolating adjacent active islands from each other, e.g., the active islands 16A, 16B and 16C on the SOI wafer 10, and which may be deposited by a convenient method. In one embodiment, the trench isolation material 50 is silicon nitride ($Si_3N_4$). In one embodiment, the trench isolation material 50 is a mixture of an oxide and a nitride of silicon. In one embodiment, the trench isolation material 50 is silicon oxynitride ($Si_xO_yN_z$), in which x, y and z are selected to yield a stoichiometrically neutral material, e.g., $Si_3N_2O_3$. In general, the silicon oxynitride is designated as simply SiON, which implicitly recognizes the unspecified stoichiometry. The trench isolation material 50 may be any other insulating or dielectric material, which provides the desired function of the trench isolation material.

The trench isolation material 50 may be deposited in the isolation trench 28 by any method known in the art. In one embodiment, the trench isolation material 50 is deposited by CVD. In one embodiment, the trench isolation material 50 is deposited by plasma enhanced CVD. In one embodiment, the trench isolation material 50 is deposited by sputtering. In one embodiment, the trench isolation material 50 is silicon dioxide derived from tetraethyl orthosilicate (TEOS). In one embodiment, the trench isolation material 50 is deposited by high density plasma (HDP). In one embodiment, the trench isolation material 50 is silicon dioxide deposited by HDP. In one embodiment, the trench isolation material 50 is deposited by plasma vapor deposition (PVD). In one embodiment, the sputtering method may include one or more of collimated sputtering, RF sputtering, magnetron sputtering or evaporative sputtering. In one embodiment, the PVD method may be a collimated PVD. In one embodiment, the method is thermal CVD. In one embodiment, trench isolation material 50 is deposited by ion metal plasma deposition. In one embodiment, trench isolation material 50 is deposited by a plasma enhanced process for providing $SiO_x$-filled gaps such as the methods disclosed in U.S. Pat. No. 6,106,678. Other known directional deposition methods may be employed.

The trench isolation material 50 may be deposited by forming a layer of the material over the entire surface of the SOI wafer 10, including filling all gaps such as the isolation trench 28, by any of the above-described methods. The trench isolation material 50 may be deposited by any other method known in the art for forming and applying such materials to the surface of a semiconductor device.

In an embodiment in which both the pad oxide layer 20 and the trench isolation material 50 are the same material or are substantially similar materials, these structures may form a combined structure of which the parts are essentially indistinguishable from each other, although they were formed by different process steps at different times in the method of the present invention. In one such embodiment, the pad oxide layer 20 and the trench isolation material 50 are both silicon dioxide. In another such embodiment, the pad oxide layer 20 and the trench isolation material 50 are chemically indistinguishable from each other, and in one embodiment the pad oxide layer 20 and the trench isolation material 50 differ only on a sub-microscopic or crystallographic scale.

Following deposition of the trench isolation material 50, excess material is removed from the SOI wafer 10, to produce the SOI wafer 10 shown in FIG. 1. In the SOI wafer 10 shown in FIG. 1, the silicon active layers of respective adjacent active islands, e.g., the active islands 16A, 16B and 16C, have been separated by a shallow trench isolation (STI) structure 18. The STI structure 18 shown in FIG. 1 is formed of the trench isolation material 50.

The excess material which is removed from the SOI wafer includes any remaining layers applied in carrying out the method of the present invention, such as the pad oxide layer 20 and the hard mask layer 22, and any excess trench isolation material 50, such as that shown in FIG. 11 above the upper surface of the active islands 16A, 16B and 16C. These layers and any other excess materials are removed by techniques known in the art, such as by wet etching or chemical mechanical polishing (CMP). In one embodiment, the hard mask layer 22 is a nitride, and is removed by a wet nitride strip.

In one embodiment, as a final step in removing excess material, the surface of the SOI wafer 10, including the layers 20 and 22 and the portion of the surface formed by the trench isolation material 50 above the upper surface of the silicon active layer 16, is removed by CMP. This method of removing excess material may be used if appropriate. If any other structures are present on the SOI wafer 10, CMP may not be appropriate. In an embodiment in which semiconductor devices have previously been formed on the SOI wafer 10, CMP is not be appropriate, and another method, such as wet or dry etching, must be used.

Figure 12:
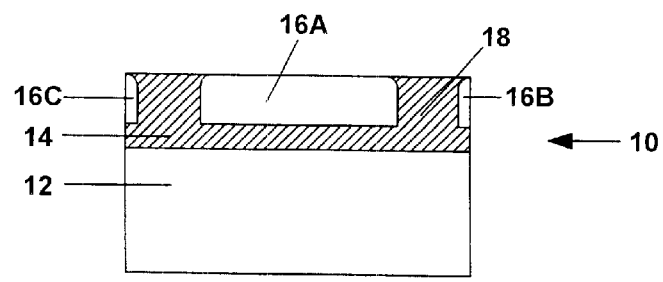
FIG. 12 is a partial cross-sectional view of another embodiment of an SOI wafer following formation of a shallow trench isolation structure, similar to that shown in FIG. 1, in accordance with the present invention.

FIG. 12 shows an embodiment of the SOI wafer 10 obtained by the method of the present invention similar to that shown in FIG. 1. The shading in FIG. 12 has been modified from that employed in FIGS. 1–11 to emphasize the following features. As suggested by FIG. 12, in one embodiment, both the shallow trench isolation structure 18 (which includes the trench isolation material 50) and the dielectric insulation layer 14 are formed of the same material or are formed of substantially similar materials, such as silicon dioxide. As depicted in FIG. 12, in such an embodiment, these structures form a combined structure in which the STI structure 18 and the dielectric insulation layer 14 are essentially indistinguishable from each other, although they were formed by different process steps at different times in the method of the present invention. In one embodiment, no distinct transition is detectable between the STI structure 18 and the dielectric insulation layer 14. The SOI wafer 10 shown in FIG. 12 is a schematic representation of such a structure, in which the separate parts are not distinctly separated. In one embodiment, the trench isolation material 50 and the dielectric insulation layer 14 are both silicon dioxide. In one embodiment, the trench isolation material 50 and the dielectric insulation layer 14 are chemically indistinguishable from each other. In one embodiment, the trench isolation material 50 and the dielectric insulation layer 14 are identical except at a sub-microscopic or crystallographic scale, which may differ slightly due to differences in conditions by which these parts were formed.

As shown in FIGS. 1 and 12, the STI structure 18 and the dielectric insulation layer 14 combine to provide compete electrical isolation between the active islands 16A, 16B and 16C on the SOI wafer 10.

Figure 13:
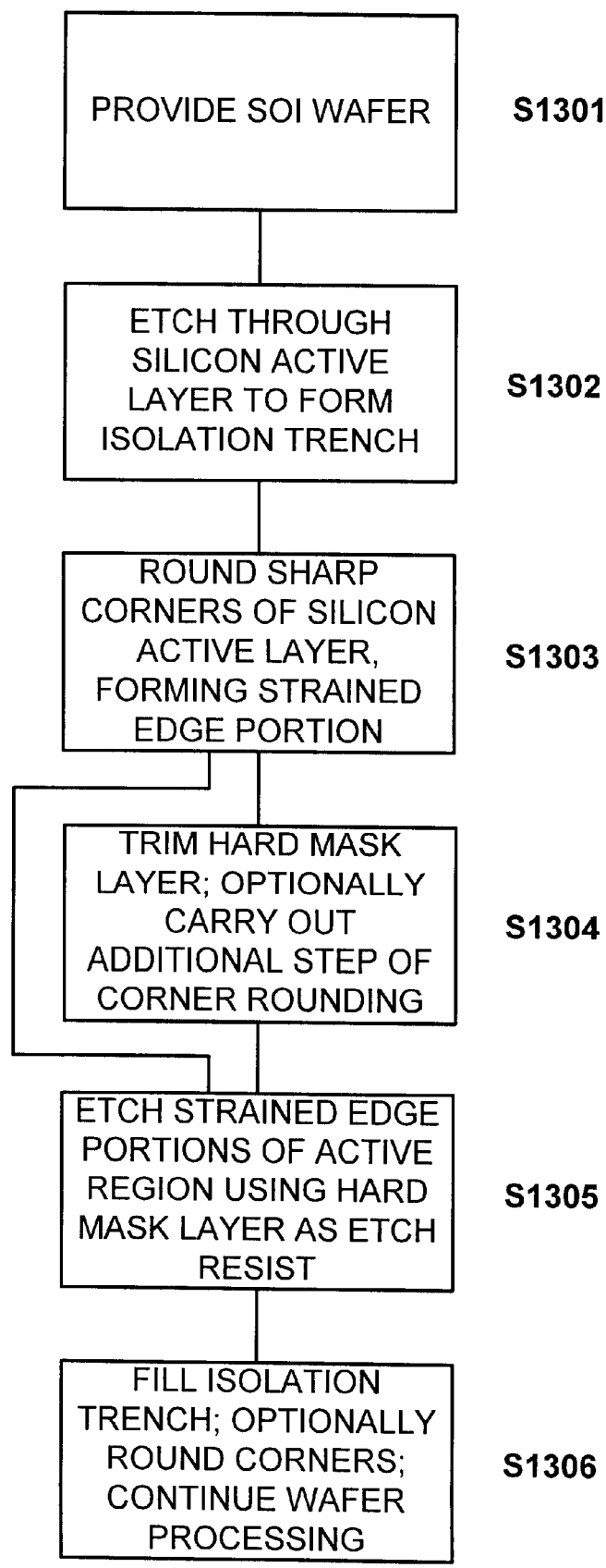
FIG. 13 is a is a flow diagram of one embodiment of a method of isolation of active islands on an SOI wafer in accordance with the present invention.

FIG. 13 is a block flow diagram illustrating the method of the present invention. As shown in FIG. 13, in one embodiment, the present invention relates to a method of isolation of active islands on a silicon-on-insulator semiconductor device. A first step of the method, shown in FIG. 13, is step S1301, in which a silicon-on-insulator (SOI) semiconductor wafer is provided. The SOI wafer includes a silicon active layer, a dielectric insulation layer and a silicon substrate, in which the silicon active layer is formed on the dielectric insulation layer and the dielectric insulation layer is formed on the silicon substrate. The SOI wafer may be made by any method known in the art.

In a second step, step S1302 in FIG. 13, an isolation trench is formed in the silicon active layer of the SOI wafer by etching through the silicon active layer to the bottom of the nascent isolation trench. In one embodiment, the etching stops when the etching reaches the dielectric insulation material. In one embodiment, the etching continues into, but does not penetrate through, the dielectric insulation material. It may be necessary to allow the etching to continue into the dielectric insulation material in order to assure that the isolation trench has been fully formed, i.e., that the etching reaches the dielectric insulation layer across the full width of the isolation trench.

The step S1302 may include one or a plurality of additional steps, such as forming a pad oxide layer, forming a hard mask layer, and forming a photoresist layer having a predetermined pattern by lithography, in addition to the etching step. The etching step, as well as the additional steps, may be carried out by any methods known in the art.

In a third step, step S1303 in FIG. 13, at least one corner of the active island in an upper portion of the silicon active layer is rounded. In one embodiment, a rounded upper corner is formed by an oxidation of the silicon of the silicon active layer, in which the upper sharp corner of the silicon active layer becomes rounded. In one embodiment, the step of rounding corners is carried out by a thermal oxidation of the silicon surface of the active island at a temperature in the range from about 800° C. to about 1000° C. in an oxygen-containing atmosphere. As a result of the rounding step, a rounded lower corner is also formed by the rounding conditions, i.e., the bird's beak. The bird's beak is an undesirable side effect of the rounding step used to round the upper corners of the active islands. In one embodiment, the degree of rounding (i.e., the radius of curvature) applied to the upper sharp corner is greater than the degree of rounding which results, or the amount of bird's beak formed, at the lower corner of the active islands. In one embodiment, concomitant with formation of the bird's beak, a strained edge portion of the active island is formed. The strained edge portion may result in undesirable electronic effects in the functioning of the active island. In one embodiment, the strained edge portion is formed when the oxides which form the bird's beak exert a deforming stress on the silicon active island.

In an optional fourth step, shown as step S1304 in FIG. 13, the hard mask layer 22 is trimmed. As shown in FIG. 13, in one embodiment, the process may proceed directly from step S1303 to step S1305. In this embodiment, the hard mask is used directly without change as an etch mask for the step of removing the strained edge portion. As shown in FIG. 13, in one embodiment, following step S1303, the next step is step S1304, in which the hard mask layer 22 is trimmed. In this embodiment, the hard mask layer 22 is trimmed by any appropriate method of etching which is selectively etches nitride or the material of the hard mask layer 22, prior to the step S1305. The trimming reduces the size of the etch mask, and thus results in an increase in the size of the part of the strained edge portion which is removed in the step of removing. As shown in FIG. 13, in another embodiment, in step S1304 the hard mask layer 22 is trimmed, and thereafter the trench sidewalls are subjected to another step of corner rounding, in order to assure that the upper corners are adequately rounded. As indicated in FIG. 13, the additional corner rounding is an optional additional step.

In a fifth step, shown as step S1305 in FIG. 13, the strained edge portion is removed by etching it away. In one embodiment, the strained edge portion is removed by a directionally controlled, anisotropic etching, such as reactive ion etching (RIE). In order to etch away only the strained edge portion, the hard mask layer is used as an etch mask. The extent of the active island covered by the hard mask, and thereby the definition of the size of the central portion, is selected based upon the extent of the bird's beak expected or observed to be formed in the corner rounding step. As noted above, in one embodiment, the hard mask layer 22 is trimmed prior to the step of removing the strained edge portion 42.

Any method known in the art for etching the various layers which have been applied over the silicon active layer of the SOI wafer may be used to etch away the strained edge portion. In one embodiment, an etch is used which is selective to nitride and oxide, which thereby etches substantially only the strained edge portion. In another embodiment, the etch used is selective to nitride, which thereby etches substantially only the sidewall oxide layer 40, a portion of the pad oxide layer 20 and the strained edge portion 42. In one embodiment, the etching step to remove the strained edge portion also removes a portion of the sidewall oxide layer 40 which was formed during the corner rounding step. The step of removing the strained edge portion results in an increase in width of the isolation trench.

In one embodiment, the step of removing the strained edge portion results in partial loss of the rounded upper corner of the active island, leaving a rounded upper corner in the active island of a reduced size. In one embodiment, in order to forestall this loss, after the hard mask layer 22 is trimmed, an additional step of corner rounding is carried out. In another embodiment, a further step of corner rounding may be carried out following the step of removing the strained edge portions. The further step of rounding may be carried out before or during the following step of filling the isolation trench. By during the filling step, it is intended that the isolation trench be partially filled, the further step of corner rounding is carried out, and then the remainder of the trench is filled, as described herein.

In the fifth step, shown as step S1306 in FIG. 13, the isolation trench is at least partially filled, from the trench bottom to a level at least above the upper surface of the silicon active layer, with a trench isolation material. In one embodiment, the trench is filled with a trench isolation material to a level above the top surface of the highest remaining layer applied over the surface of the SOI wafer, for example, the hard mask layer. In one embodiment, the isolation trench is partially filled in a first filling step, a further step of re-rounding the upper corners of the active islands is carried out, and then the filling of the isolation trench is completed in a second filling step. In one embodiment, the step of filling is carried out by applying a layer of an insulating material, such as silicon dioxide, over substantially the entire surface of the SOI wafer, which includes filling the isolation trench. In an embodiment in which the trench is filled in two filling steps, the first filling step may be by a directional deposition in which substantially only the lower portions of the isolation trench are filled in the first filling step. Step S1305 may be carried out by any method known in the art for depositing such materials.

Following the filling step, the SOI wafer may be further processed by, e.g., removing excess material such as the pad oxide layer, the hard mask layer and excess trench isolation material, from the surface of the SOI wafer.

Following the steps of the present invention, the SOI wafer may be further processed in the fabrication of semiconductor devices in known manner.

In one embodiment, the method of the present invention provides a shallow trench isolation structure which substantially completely electrically isolates and which defines an active island in the silicon active layer of the SOI wafer. In one embodiment, the shallow trench isolation structure and the dielectric insulation layer form an integral isolation structure for and define an active island in the silicon active layer of the SOI wafer.

What has been described above are certain embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method of isolation of active islands on a silicon-on-insulator semiconductor device, comprising the steps of:
   providing a silicon-on-insulator semiconductor wafer having a silicon active layer, a dielectric insulation layer and a silicon substrate, in which the silicon active layer is formed on the dielectric insulation layer and the dielectric insulation layer is formed on the silicon substrate;
   etching through the silicon active layer to form an isolation trench, the isolation trench defining an active island in the silicon active layer, the active island having at least one upper sharp corner;
   rounding the at least one upper sharp corner of the active island, whereby at least one strained edge portion of the active island is formed;
   removing at least a part of the at least one strained edge portion; and
   at least partially filling the isolation trench with a dielectric trench isolation material to form a shallow trench isolation structure.

2. The method of claim 1, wherein the step of removing includes using a hard mask layer as an etch mask, leaving at least a part of the strained edge portion unmasked.

3. The method of claim 2, wherein the step of removing includes trimming the hard mask layer.

4. The method of claim 2, wherein the step of etching the unmasked part of the strained edge portion etches through a portion of the active island to the dielectric insulation layer.

5. The method of claim 1, further comprising steps of forming a pad oxide, a hard mask and a photoresist prior to the step of etching through the silicon active island.

6. The method of claim 3, further comprising a further step of corner rounding following the trimming.

7. The method of claim 1, wherein at least a partially rounded corner remains on the active island following the step of removing the strained edge portion.

8. The method of claim 1, wherein after the isolation trench is partially filled, a further step of corner rounding is carried out.

9. The method of claim 8, wherein following the further step of corner rounding, the isolation trench is filled.

10. The method of claim 1, further comprising a step of oxidizing silicon on sidewalls of the isolation trench.

11. The method of claim 10, where in the step of oxidizing silicon on sidewalls occurs substantially simultaneously with the step of rounding the at least one upper sharp corner.

12. The method of claim 1 0, wherein the step of the step of oxidizing silicon on sidewalls takes place after the step of removing the strained edge portion.

13. The method of claim 10, wherein the step of oxidizing silicon on sidewalls forms a trench oxide liner in the isolation trench.

14. The method of claim 10, wherein the trench oxide liner and the dielectric insulation layer form an integral isolation structure for and define the active island.

15. A method of shallow trench isolation of active islands on a silicon-on-insulator semiconductor device, comprising the steps of:
   providing a silicon-on-insulator semiconductor wafer having a silicon active layer, a dielectric insulation layer and a silicon substrate, in which the silicon active layer is formed on the dielectric insulation layer and the dielectric insulation layer is formed on the silicon substrate;
   forming a hard mask layer over the silicon active layer;
   etching through the hard mask layer and the silicon active layer to form an isolation trench, the isolation trench defining an active island in the silicon active layer, the active island having at least one upper sharp corner;

rounding the at least one upper sharp corner of the active island to form at least one upper rounded corner, whereby at least one strained edge portion of the active island is formed;

trimming the hard mask layer;

removing at least a part of the at least one strained edge portion by etching the at least one strained edge portion using the trimmed hard mask layer as an etch mask; and filling the isolation trench with a dielectric trench isolation material to form a shallow trench isolation structure.

16. The method of claim 15, wherein each of the dielectric insulation layer and the dielectric trench isolation material is silicon dioxide.

* * * * *

UNITED STATES PATENT AND TRADEMARK OFFICE
CERTIFICATE OF CORRECTION

PATENT NO.    : 6,521,510 B1
DATED         : February 18, 2003
INVENTOR(S)   : Fisher et al.

It is certified that error appears in the above-identified patent and that said Letters Patent is hereby corrected as shown below:

Column 6,
Lines 7 and 41, replace "SO wafer" with -- SOI wafer --

Column 20,
Line 42, replace "where in" with -- wherein --

Signed and Sealed this

Twenty-ninth Day of July, 2003

JAMES E. ROGAN
*Director of the United States Patent and Trademark Office*